US009568576B2

(12) United States Patent
Imamura (10) Patent No.: US 9,568,576 B2
(45) Date of Patent: Feb. 14, 2017

(54) MAGNETIC RESONANCE IMAGING APPARATUS AND MAGNETIC RESONANCE IMAGING METHOD

(71) Applicant: TOSHIBA MEDICAL SYSTEMS CORPORATION, Otawara-shi (JP)

(72) Inventor: Naho Imamura, Nasushiobara (JP)

(73) Assignee: TOSHIBA MEDICAL SYSTEMS CORPORATION, Otawara-shi (JP)

(*) Notice: Subject to any disclaimer, the term of this patent is extended or adjusted under 35 U.S.C. 154(b) by 906 days.

(21) Appl. No.: 13/849,615

(22) Filed: Mar. 25, 2013

(65) Prior Publication Data

US 2013/0249552 A1  Sep. 26, 2013

(30) Foreign Application Priority Data

Mar. 26, 2012 (JP) ................................. 2012-070110
Feb. 20, 2013 (JP) ................................. 2013-031398

(51) Int. Cl.
G01V 3/00 (2006.01)
G01R 33/48 (2006.01)
G01R 33/58 (2006.01)
G01R 33/54 (2006.01)
G01R 33/56 (2006.01)

(52) U.S. Cl.
CPC ........... *G01R 33/4828* (2013.01); *G01R 33/58* (2013.01); *G01R 33/583* (2013.01); *G01R 33/543* (2013.01); *G01R 33/5607* (2013.01)

(58) Field of Classification Search
CPC .................................................. G01R 33/58
USPC ........................................ 324/314, 307, 309
See application file for complete search history.

(56) References Cited

U.S. PATENT DOCUMENTS

| 4,728,889 | A | * | 3/1988 | Gadian | ................ G01R 33/465 324/307 |
| 6,091,242 | A | | 7/2000 | Hanawa | |
| 7,808,239 | B2 | * | 10/2010 | Miyazaki | ............. G01R 33/543 324/309 |
| 8,115,485 | B1 | * | 2/2012 | Maier | .................. G01R 33/543 324/307 |
| 8,436,611 | B2 | * | 5/2013 | Kitane | ............... G01R 33/4828 324/307 |
| 2008/0238421 | A1 | | 10/2008 | Kitane et al. | |
| 2011/0304331 | A1 | | 12/2011 | Takahashi et al. | |
| 2012/0119740 | A1 | | 5/2012 | Takahashi et al. | |

FOREIGN PATENT DOCUMENTS

| JP | 11-076193 | 3/1999 |
| JP | 2009-034152 A | 2/2009 |

OTHER PUBLICATIONS

Chinese Office Action dated Oct. 15, 2014, in CN 201310097373.0.
Japanese Office Action dated Dec. 20, 2016 in JP 2013-031398.

* cited by examiner

*Primary Examiner* — Louis Arana
(74) *Attorney, Agent, or Firm* — Nixon & Vanderhye, P.C.

(57) ABSTRACT

A magnetic resonance imaging apparatus according to an embodiment includes a collecting unit and an identifying unit. The collecting unit collects at least one frequency spectrum out of a plurality of frequency spectra by performing a pre-scan in which a first substance is frequency-selectively suppressed or enhanced. The identifying unit analyzes the frequency spectra and identifies a resonance frequency of a second substance on the basis of analysis results.

19 Claims, 10 Drawing Sheets

PERFORM FAT-SUPPRESSED STIR SEQUENCE

CANDIDATE CF (f0') OF RESONANCE
FREQUENCY OF WATER

PERFORM FAT-SUPPRESSED CHESS SEQUENCE

IDENTIFY RESONANCE FREQUENCY

FIG.10

MAGNETIC RESONANCE IMAGING APPARATUS AND MAGNETIC RESONANCE IMAGING METHOD

CROSS-REFERENCE TO RELATED APPLICATIONS

This application is based upon and claims the benefit of priority from Japanese Patent Application No. 2012-070110, filed on Mar. 26, 2012; and Japanese Patent Application No. 2013-031398, filed on Feb. 20, 2013, the entire contents of all of which are incorporated herein by reference.

FIELD

Embodiments described herein relate generally to a magnetic resonance imaging apparatus and a magnetic resonance imaging method.

BACKGROUND

Generally, in a magnetic resonance imaging apparatus (hereinafter, also referred to as an MRI apparatus), a resonance frequency of water, which is a collection target of signals, is set to a center frequency of radio frequency pulses when performing a pulse sequence. For this reason, a frequency spectrum is collected by performing a fat suppression pulse sequence in a pre-scan performed prior to a main scan by which a diagnostic image is collected, and the resonance frequency of water is identified by analyzing the frequency spectrum.

In an example of such conventional MRI apparatus, the frequency spectrum is collected by performing a pulse sequence with a short time inversion recovery (STIR) technique in the pre-scan and identifies a maximum peak of the frequency spectrum as the resonance frequency of water. In another example of the conventional MRI apparatus, the frequency spectrum is displayed on a display thereof, and a user visually selects a peak of the frequency spectrum displayed on the display and identifies the resonance frequency of water. It is difficult to identify the resonance frequency of water in some cases, such as a case where a maximum peak is not always the resonance frequency of water, and another case where a plurality of peaks are present as candidates, and still another case where disturbance occurs in a spectrum waveform due to a high fat content. In the STIR technique, a signal is collected at timing of an inversion time when longitudinal magnetization of fat reaches its null point by utilizing a difference in longitudinal relaxation time between substances.

DETAILED DESCRIPTION

A magnetic resonance imaging apparatus according to an embodiment includes a collecting unit and an identifying unit. The collecting unit collects at least one frequency spectrum out of a plurality of frequency spectra by performing a pre-scan in which a first substance is frequency-selectively suppressed or enhanced. The identifying unit analyzes the frequency spectra and identifies a resonance frequency of a second substance on the basis of analysis results.

First Embodiment

Figure 1:
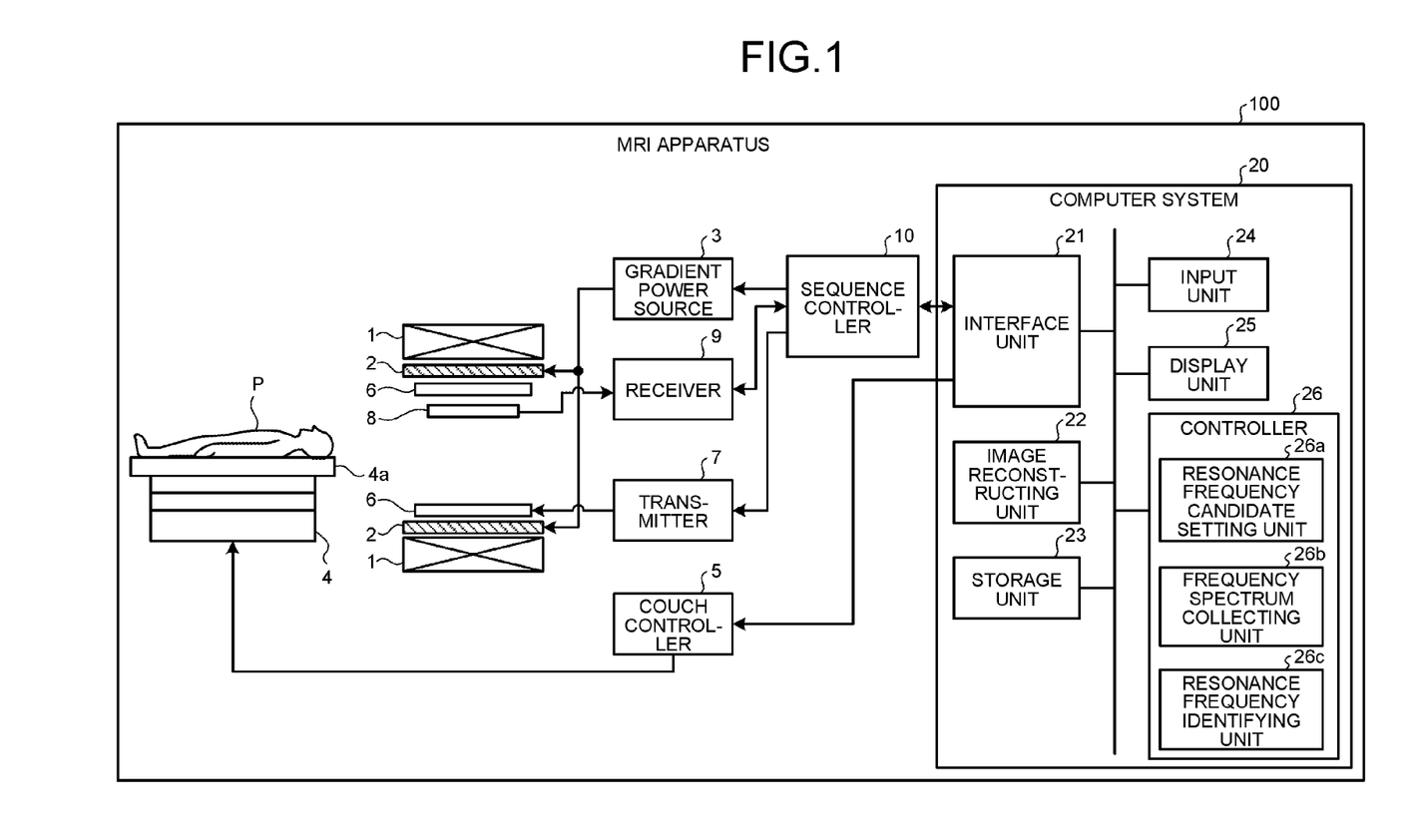
FIG. 1 is a block diagram illustrating a structure of a magnetic resonance imaging (MRI) apparatus according to a first embodiment.

Embodiments of a magnetic resonance imaging apparatus and a magnetic resonance imaging method are described below. FIG. 1 is a block diagram illustrating a structure of a magnetic resonance imaging (MRI) apparatus 100 according to a first embodiment. A subject P is not comprised in the MRI apparatus 100.

A magnetostatic magnet 1, which is formed in a hollow cylindrical shape, generates a static magnetic field uniformly inside the hollow. The magnetostatic magnet 1 is a permanent magnet or a superconductivity magnet, for example. A gradient coil 2, which is formed in a hollow cylindrical shape, generates a gradient magnetic field inside the hollow. Specifically, the gradient coil 2 is disposed inside the magnetostatic magnet 1 and generates the gradient magnetic field with the supply of a current from a gradient power source 3. The gradient power source 3 supplies a current to the gradient coil 2 in accordance with a control signal transmitted from a sequence controller 10.

A couch 4 is provided with a couch top 4a on which the subject P is placed, and the couch top 4a with the subject P placed thereon is inserted into the hollow, which serves as an image opening, of the gradient coil 2. Generally, the couch 4 is disposed such that the longitudinal direction thereof is in parallel with the central axis of the magnetostatic magnet 1. A couch controller 5 drives the couch 4 and moves the couch top 4a in the longitudinal direction and the vertical direction.

A transmission coil 6 generates a high frequency magnetic field. Specifically, the transmission coil 6 is disposed inside the gradient coil 2 and generates a high frequency magnetic field with the supply of radio frequency (RF) pulses supplied from a transmitter 7. The transmitter 7 transmits the RF pulses corresponding to a Larmor frequency to the transmission coil 6 in accordance with a control signal transmitted from the sequence controller 10.

A receiving coil 8 receives a magnetic resonance signal (hereinafter referred to as an MR signal). Specifically, the receiving coil 8 is disposed inside the gradient coil 2 and receives an MR signal emitted from the subject P under the influence of the high frequency magnetic field. The receiving coil 8 outputs the received MR signal to a receiver 9.

The receiver 9 produces MR signal data on the basis of the MR signal output from the receiving coil 8 in accordance with a control signal transmitted from the sequence controller 10. Specifically, the receiver 9 converts the MR signal output from the receiving coil 8 into a digital form to produce the MR signal data and transmits the produced MR signal data to a computer system 20 through the sequence controller 10. The receiver 9 may be provided to a gantry comprising the magnetostatic magnet 1 and the gradient coil 2.

The sequence controller 10 controls the gradient power source 3, the transmitter 7, and the receiver 9. Specifically, the sequence controller 10 transmits the control signals based on pulse sequence execution data transmitted from the computer system 20 to the gradient power source 3, the transmitter 7, and the receiver 9.

The computer system 20 comprises an interface unit 21, an image reconstructing unit 22, a storage unit 23, an input unit 24, a display unit 25, and a controller 26. The interface unit 21, which is connected to the sequence controller 10, controls input and output of data exchanged between the sequence controller 10 and the computer system 20. The image reconstructing unit 22 reconstructs image data from the MR signal data transmitted from the sequence controller 10 and stores the reconstructed image data in the storage unit 23.

The storage unit 23 stores therein the image data entered by the image reconstructing unit 22 and other data used in the MRI apparatus 100. The storage unit 23 is a semiconductor memory element such as a random access memory (RAM) or a flash memory, a hard disk, or an optical disk, for example.

The input unit 24 receives various instructions and imaging instructions from an operator, for example. The input unit 24 is a mouse or a keyboard, for example. The display 25 displays an editing screen of imaging conditions or images, for example. The display 25 is a liquid crystal display, for example.

The controller 26 controls the whole of the MRI apparatus 100 by controlling each of the components described above. For example, when receiving an editing of the imaging conditions from an operator, the controller 26 produces the pulse sequence execution data on the basis of the received imaging conditions, and transmits the produced pulse sequence execution data to the sequence controller 10. For example, the controller 26 is an integrated circuit such as an application specific integrated circuit (ASIC) or a field programmable gate array (FPGA), or an electronic circuit such as a central processing unit (CPU) or a micro processing unit (MPU) providing digital signal processing circuits.

The controller 26 in the first embodiment comprises a resonance frequency candidate setting unit 26a, a frequency spectrum collecting unit 26b, and a resonance frequency identifying unit 26c, and identifies the resonance frequency of a desired substance with high accuracy. The resonance frequency candidate setting unit 26a and the frequency spectrum collecting unit 26b may be called a "collecting unit", for example. The resonance frequency identifying unit 26c may be called an "identifying unit", for example.

Specifically, the resonance frequency candidate setting unit 26a sets a candidate of the resonance frequency of a certain substance (water in the first embodiment). For example, the resonance frequency candidate setting unit 26a performs a pulse sequence with a short time inversion recovery (STIR) technique (also called a fat-suppressed STIR sequence) by controlling each component described above, and collects the frequency spectrum. The resonance frequency candidate setting unit 26a analyzes the collected frequency spectrum and sets a peak having a maximum peak value among a plurality of peaks as the candidate of the resonance frequency of water. Hereinafter, the candidate of the resonance frequency of water set by the resonance frequency candidate setting unit 26a is described as "CF (f0')". The candidate of the resonance frequency of water is also the candidate of the center frequency of water. Thus, CF, which is the abbreviation of center frequency, is used.

The resonance frequency candidate setting unit 26a may collect the frequency spectrum by performing the pulse sequence with the STIR technique while an offset magnetic field is applied in shimming imaging in which data used for uniform correction of the intensity of the static magnetic field is collected. Alternatively, the resonance frequency candidate setting unit 26a may collect the frequency spectrum by performing the pulse sequence with the STIR technique alone independently from the shimming imaging. In the former case, the resonance frequency candidate setting unit 26a collects the frequency spectrum using only a slice of a central portion in an imaging area used for the uniform correction of the intensity of the static magnetic field as the imaging area. Alternatively, the resonance frequency candidate setting unit 26a collects the frequency spectrum using the whole area of the imaging area used for the uniform correction of the intensity of the static magnetic field as the imaging area.

The frequency spectrum collecting unit 26b sets a certain frequency found on the basis of the candidate of the resonance frequency set by the resonance frequency candidate setting unit 26a to the center frequency of pre-pulses, and collects the frequency spectrum by performing the pulse sequence using the pre-pulses. For example, the frequency spectrum collecting unit 26b sets the frequency apart from CF (f0') in the plus direction by 3.5 ppm as the center frequency of the pre-pulses (also called an "excitation frequency", for example), and collects the frequency spectrum by performing a pulse sequence with a chemical shift selective (CHESS) technique (also called a "fat-suppressed CHESS sequence"). As for the waveform of the pre-pulses (also called "fat-suppressed pulses" or "CHESS pulses", for example), any waveform such as adiabatic pulses can be used. As for the angle of a flip angle, any angle can be set.

In the CHESS technique, the center frequency of fat is set to the center frequency of the pre-pulses on the basis of the difference in resonance frequency among substances and collects signals after frequency-selectively suppressing an adipose tissue. The reason why the frequency apart from the CF (f0') in the plus direction by 3.5 ppm is set to the center frequency of the pre-pulses is that it is known that there is a difference of 3.5 ppm in resonance frequency between water and fat. Hereinafter, the frequency apart from the candidate of the resonance frequency of water by 3.5 ppm is appropriately referred to as the "candidate of the resonance frequency of fat".

In the first embodiment, the frequency spectrum collecting unit 26b performs the pulse sequence with the CHESS technique on a plurality of candidates of the resonance frequency of fat by shifting the candidate of the resonance frequency set by the resonance frequency candidate setting unit 26a with offsets, and collects a plurality of frequency spectra.

In the first embodiment, the resonance frequency identifying unit 26c analyzes the collected frequency spectra for each frequency spectrum and compares the analysis results among the frequency spectra. The resonance frequency identifying unit 26c identifies the center frequency of the pre-pulses corresponding to a case where fat is suppressed at the highest level as the resonance frequency of fat, and also identifies the frequency apart from the identified resonance frequency of fat by 3.5 ppm as the resonance frequency of water.

Figure 2:
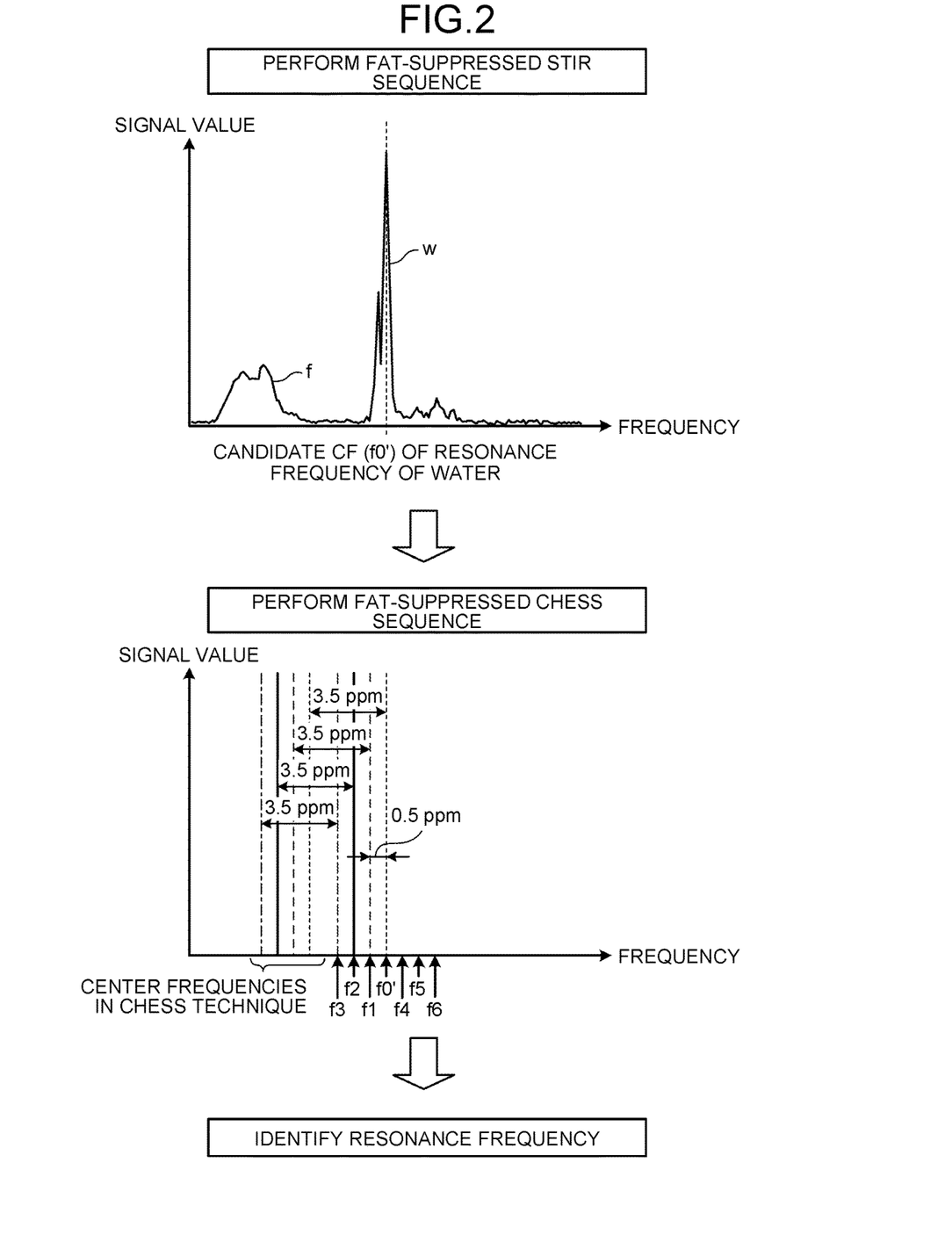
FIG. 2 is a schematic diagram to explain an overview of the first embodiment.

FIG. 2 is a schematic diagram to explain an overview of the first embodiment. As illustrated in FIG. 2, in the embodiment, the resonance frequency candidate setting unit 26a performs the pulse sequence with the STIR technique and collects the frequency spectrum. When fat is completely suppressed by the STIR technique, a spectrum waveform w of water having a high peak value appears in the frequency spectrum. When fat slightly remains because fat is suppressed to some extent by the STIR technique, a spectrum waveform f indicating fat and the waveform w of water having the high peak value appear in the frequency spectrum. The resonance frequency candidate setting unit 26a sets the frequency corresponding to the peak having the highest peak value (at the position on the dot line in FIG. 2) as the candidate CF (f0') of the resonance frequency of water.

Then, the frequency spectrum collecting unit 26b performs the pulse sequence with the CHESS technique on seven candidates of the resonance frequency of fat by shifting the candidate CF (f0') of the resonance frequency of water in both of the plus and minus directions with an offset of 0.5 ppm unit, for example, and collects seven frequency spectra.

In FIG. 2, the offsets are provided in the plus direction (the left direction in FIG. 2) for expository convenience. That is, from the candidate CF (f0') set by the resonance frequency candidate setting unit 26a, a candidate CF (f1) shifted in the plus direction with an offset of 0.5 ppm, a candidate CF (f2) shifted in the plus direction with an offset of 1.0 ppm, and a candidate CF (f3) shifted in the plus direction with an offset of 1.5 ppm are illustrated. The frequency spectrum collecting unit 26b sets the respective frequencies apart from the candidates CF (f0'), CF (F1), CF (f2), and CF (f3) by 3.5 ppm each to the respective center frequencies of the pre-pulses and collects the respective frequency spectra. The offset width, the number of candidates, setting manner of the offsets in the plus and minus directions can be changed in any manner.

Figure 3A:
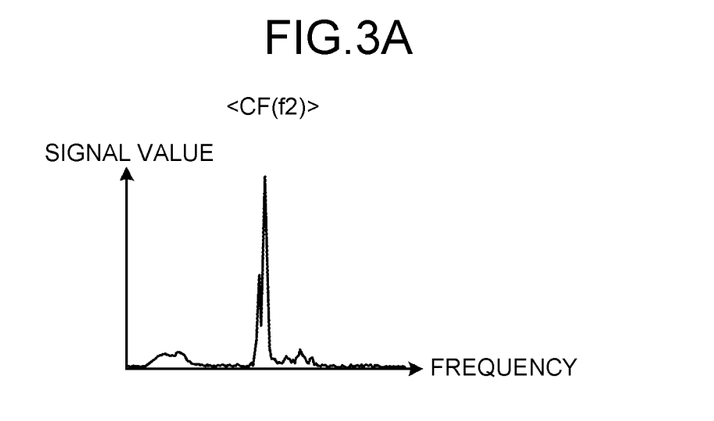
FIG. 3A is a schematic diagram to explain a frequency spectrum in the first embodiment.
Figure 3B:
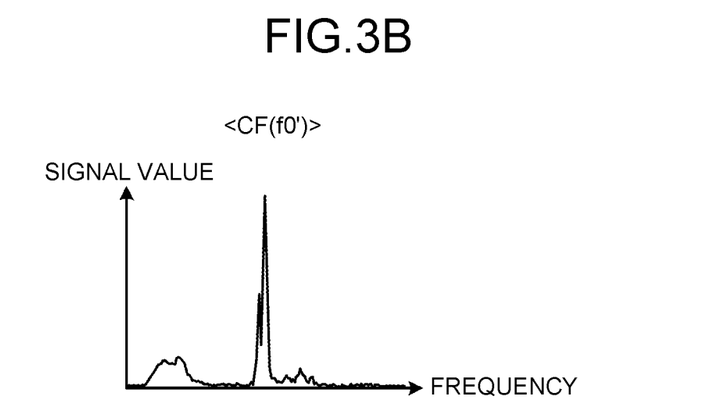
FIG. 3B is a schematic diagram to explain the frequency spectrum in the first embodiment.
Figure 3C:
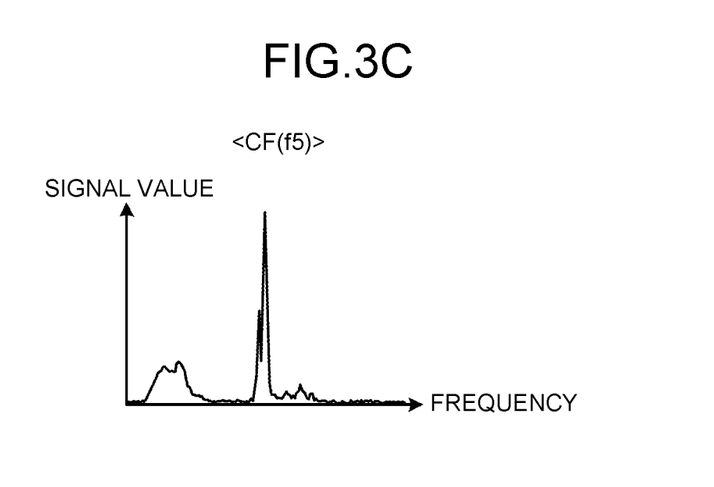
FIG. 3C is a schematic diagram to explain the frequency spectrum in the first embodiment.

Then, the resonance frequency identifying unit 26c analyzes the seven frequency spectra collected by the frequency spectrum collecting unit 26b and identifies the resonance frequency of water on the basis of the analysis results. FIGS. 3A to 3C are schematic diagrams to explain the frequency spectrum in the first embodiment. FIG. 3A illustrates the frequency spectrum collected when the frequency apart from the candidate CF (f2) by 3.5 ppm is set to the center frequency of the pre-pulses, for example. FIG. 3B illustrates the frequency spectrum collected when the frequency apart from the candidate CF (f0') by 3.5 ppm is set to the center frequency of the pre-pulses, for example. FIG. 3C illustrates the frequency spectrum collected when the frequency apart from the candidate CF (f5) by 3.5 ppm is set to the center frequency of the pre-pulses, for example. The candidate CF (f5) is shifted from the candidate CF (f0') in the minus direction with an offset of 1.0 ppm, as illustrated in FIG. 2.

The resonance frequency identifying unit 26c integrates signal values of signals included in a frequency range roughly corresponding to fat for each frequency spectrum and compares the integrated values among the frequency spectra, for example. The resonance frequency identifying unit 26c may use the signal values in the comparison among the frequency spectra instead of using the integrated values.

Figure 4A:
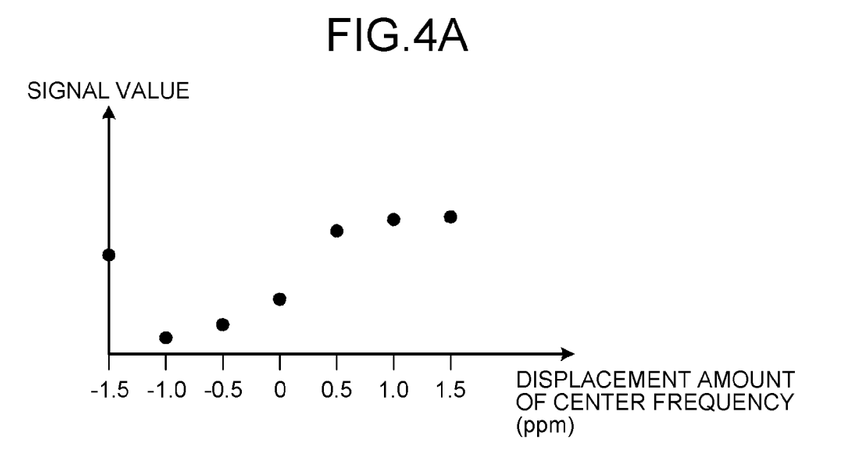
FIG. 4A is a schematic diagram to explain an identification of a resonance frequency in the first embodiment.
Figure 4B:
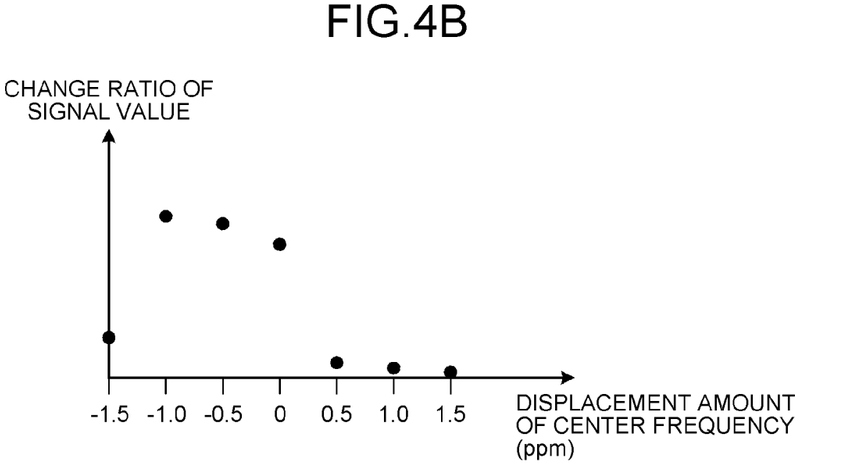
FIG. 4B is a schematic diagram to explain the identification of the resonance frequency in the first embodiment.

FIGS. 4A and 4B are schematic diagrams to explain the identification of the resonance frequency in the first embodiment. In FIGS. 4A and 4B, the abscissa axis represents the displacement amount from the candidate CF (f0') while the ordinate axis represents the signal value. For example, as illustrated in FIG. 4A, the resonance frequency identifying unit 26c compares the integrated values among frequency spectra corresponding to the respective candidates CF as internal processing. The resonance frequency identifying unit 26c identifies the center frequency of the pre-pulses corresponding to the lowest integrated value as the resonance frequency of fat and also identifies the candidate CF corresponding to the lowest integrated value (in the example in FIG. 4A, the candidate CF (f2)) as the resonance frequency of water.

The resonance frequency identifying unit 26c may calculate a value of integral of all of the signal values (corresponding to the whole area surrounded by the spectrum waveform) for the comparison instead of calculating the integrated value of the signal values of the signals included in the frequency range roughly corresponding to fat, for example. The resonance frequency identifying unit 26c may compare change ratios of the signal values among the frequency spectra corresponding to the respective candidates CF as illustrated in FIG. 4B, for example. The change ratio of the signal value is the change ratio with respect to the frequency spectrum collected when the pulse sequence with the STIR technique is performed by the resonance frequency candidate setting unit 26a, for example. As an example, the resonance frequency identifying unit 26c may calculate the ratio of the integrated value of fat when the CHESS technique is used to the integrated value of fat when the STIR technique is used, and regard that the higher the ratio is, the higher is the suppression level of fat. On the basis of this regard, the resonance frequencies of fat and water can be identified.

The resonance frequency identifying unit 26c may select the analysis result obtained from any one of the frequency spectra as a reference value, obtain change ratios of the other frequency spectra with respect to the reference value, and compare the change ratios among the frequency spectra, for example. As an example, the resonance frequency identifying unit 26c selects the change ratio of the signal value when the displacement value is "0" ppm in FIG. 4B as a reference value of "1", and obtains the change ratios of the other frequency spectra with respect to the reference value. In this case, when the ratio is "1.2", which is larger than the reference value, the suppression level of the signal value is lower than a reference whereas when the ratio is "0.8", which is smaller than the reference value, the suppression level of the signal value is higher than the reference.

As for the value used as the reference value, any value can be selected. For example, a ratio between the signal value of water and the signal value of fat may be used as the reference for the comparison.

The controller 26 further comprises a main scan unit that sets the resonance frequency identified by the resonance frequency identifying unit 26c to the center frequency of the RF pulses or pre-pulses and performs the main scan. The main scan unit is not illustrated in FIG. 1.

Figure 5:
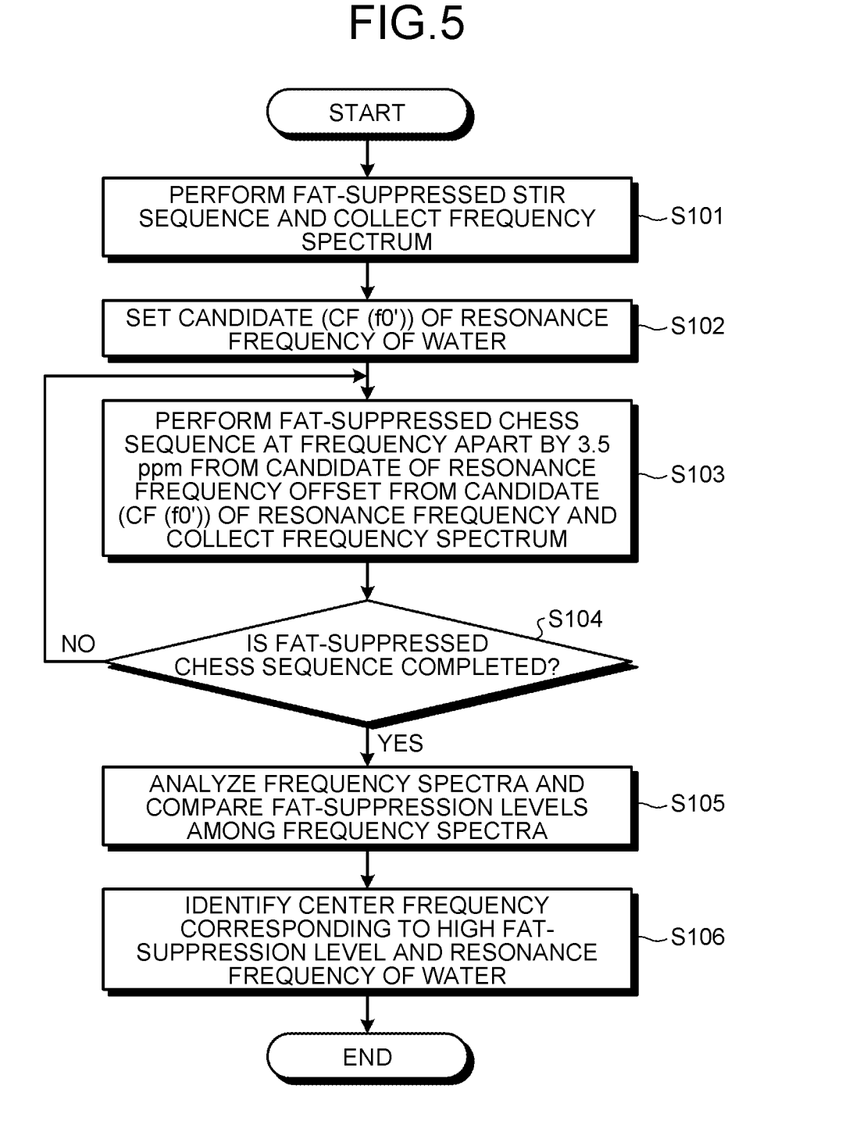
FIG. 5 is a flowchart illustrating a processing procedure in the first embodiment.

FIG. 5 is a flowchart illustrating a processing procedure in the first embodiment. As illustrated in FIG. 5, the resonance frequency candidate setting unit 26a performs the pulse sequence with the STIR technique and collects the frequency spectrum (S101). The resonance frequency candidate setting unit 26a analyzes the collected frequency spectrum and sets a peak having a maximum peak value among a plurality of peaks as the candidate CF (f0') of the resonance frequency of water (S102).

Then, the frequency spectrum collecting unit 26b performs the pulse sequence with the CHESS technique at the frequency apart from the candidate of the resonance frequency of water by 3.5 ppm, which candidate is offset against the candidate CF (f0') of the resonance frequency of water set by the resonance frequency candidate setting unit 26a, and collects the frequency spectrum (S103). The frequency spectrum collecting unit 26b repeats the processing at S103 until the processing is performed on all of the candidates (No at S104).

Then, the resonance frequency identifying unit 26c analyzes each frequency spectrum and compares the suppression levels of fat among the frequency spectra (S105). The resonance frequency identifying unit 26c identifies the center frequency of the pre-pulses corresponding to a case where fat is suppressed at the highest level as the resonance frequency of fat, and also identifies the candidate of the resonance frequency of water corresponding to the identified resonance frequency of fat as the resonance frequency of water (S106). The identified resonance frequency of water is set to the center frequency of the RF pulses or the pre-pulses and the main scan in which an image for a diagnosis is collected is performed under the setting.

The frequency spectrum collecting unit 26b may continuously perform the processing, which is repeated at S103, by changing the candidate of the resonance frequency of water at each repetition time (TR) in one sequence, for example.

As described above, the MRI apparatus 100 in the first embodiment first sets the candidate of the resonance frequency of water using the STIR technique, then finds the candidates of the resonance frequency of fat on the basis of the set candidate, and thereafter performs the pulse sequence with the CHESS technique on the found candidates as many times as required corresponding to the number of candidates. Then, the MRI apparatus 100 compares the analysis results among the collected frequency spectra and identifies the resonance frequencies of water and fat on the basis of the comparison result.

As a result, according to the first embodiment, the reliability of the resonance frequency of water set by the STIR technique can be verified. In some cases, a more reliable resonance frequency of water can be set again. Consequently, the resonance frequencies of water and fat can be identified with high accuracy. For example, the resonance frequency of water set by the STIR technique is inappropriate in some cases, such as a case where the maximum peak is not always the resonance frequency of water, and another case where a plurality of peaks are present as candidates, and still another case where disturbance occurs in the spectrum waveform due to a high fat content. In such cases, according to the first embodiment, the frequency spectra are collected on a plurality of candidates using the CHESS technique on the assumption of the presence of the other resonance frequency and an optimum resonance frequency is searched by comparing the analysis results of the frequency spectra. As a result, the resonance frequencies of water and fat can be identified with high accuracy.

Conventionally, when the resonance frequency of water set by the STIR technique is inappropriate, the main scan is performed without being aware of the inappropriateness. As a result, the inappropriate setting of the resonance frequency of water is first realized when the diagnostic image is viewed. In such a case, imaging may be redone from the pre-scan. As a result, imaging takes a longer time and the burden for both the subject and the operator of imaging increases. Even if the pre-scan is redone, it is not guaranteed that an appropriate resonance frequency is set as the result of the redoing. In contrast, according to the first embodiment, imaging time can be reduced because the appropriate resonance frequency is identified in the pre-scan stage.

First Modification of the First Embodiment

Figure 6:
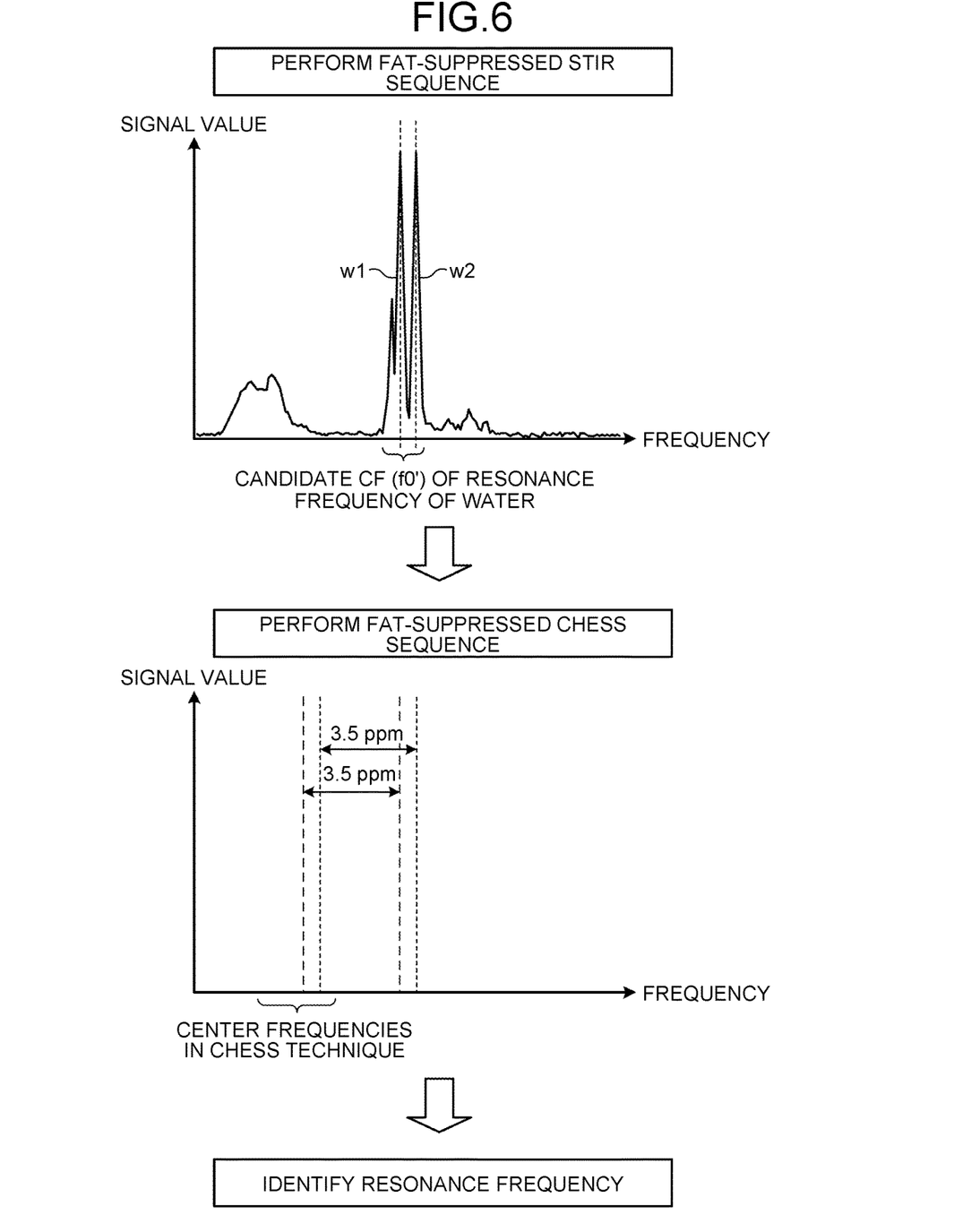
FIG. 6 is a schematic diagram to explain a first modification of the first embodiment.

FIG. 6 is a schematic diagram to explain a first modification of the first embodiment. As illustrated in FIG. 6, spectrum waveforms w1 and w2 indicating water appear as twin peaks in the frequency spectrum collected with the STIR technique in some cases, for example.

In such a case, the frequency spectrum collecting unit 26b may collect the two frequency spectra corresponding to the respective two peaks in the actually collected frequency spectrum as illustrated in FIG. 6 by focusing on them as the targets without collecting a plurality of frequency spectra using a predetermined offset, for example.

In this case, the imaging time can be further reduced because the number of frequency spectra collected by the frequency spectrum collecting unit 26b is decreased. The frequency spectrum collecting unit 26b may select pattern 1 in which the frequency spectra are collected using a predetermined offset and pattern 2 in which the frequency spectra are collected by focusing on two targets on the basis of an analysis result of the frequency spectrum collected by the STIR technique. For example, when the frequency spectrum collected by the STIR technique is analyzed and the result shows that two similar spectrum waveforms notably appear as the spectrum waveform of water, the frequency spectrum collecting unit 26b selects pattern 2. When determining that the spectrum waveform of water does not appear as twin peaks because disturbance occurs overall in the spectrum waveform, the frequency spectrum collecting unit 26b selects pattern 1.

Second Modification of the First Embodiment

Figure 7:
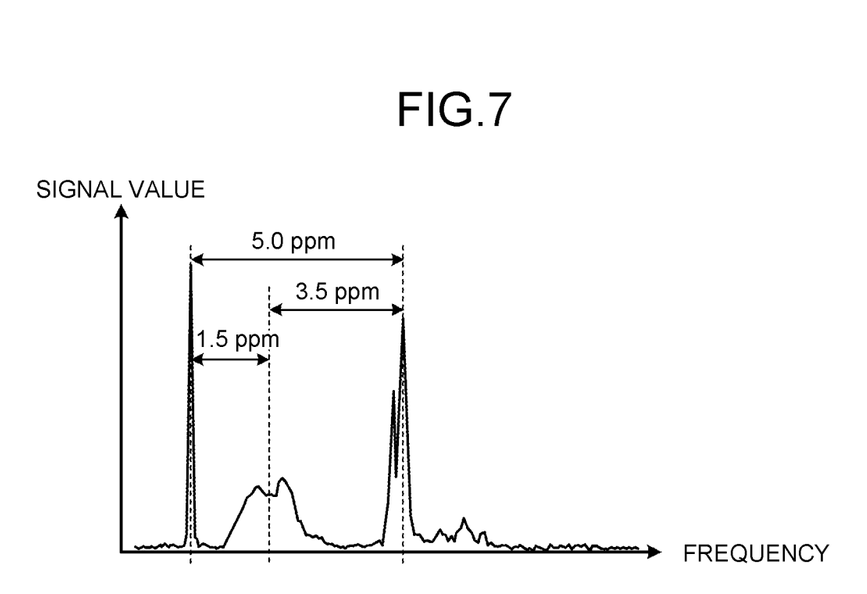
FIG. 7 is a schematic diagram to explain a second modification of the first embodiment.
Figure 8:
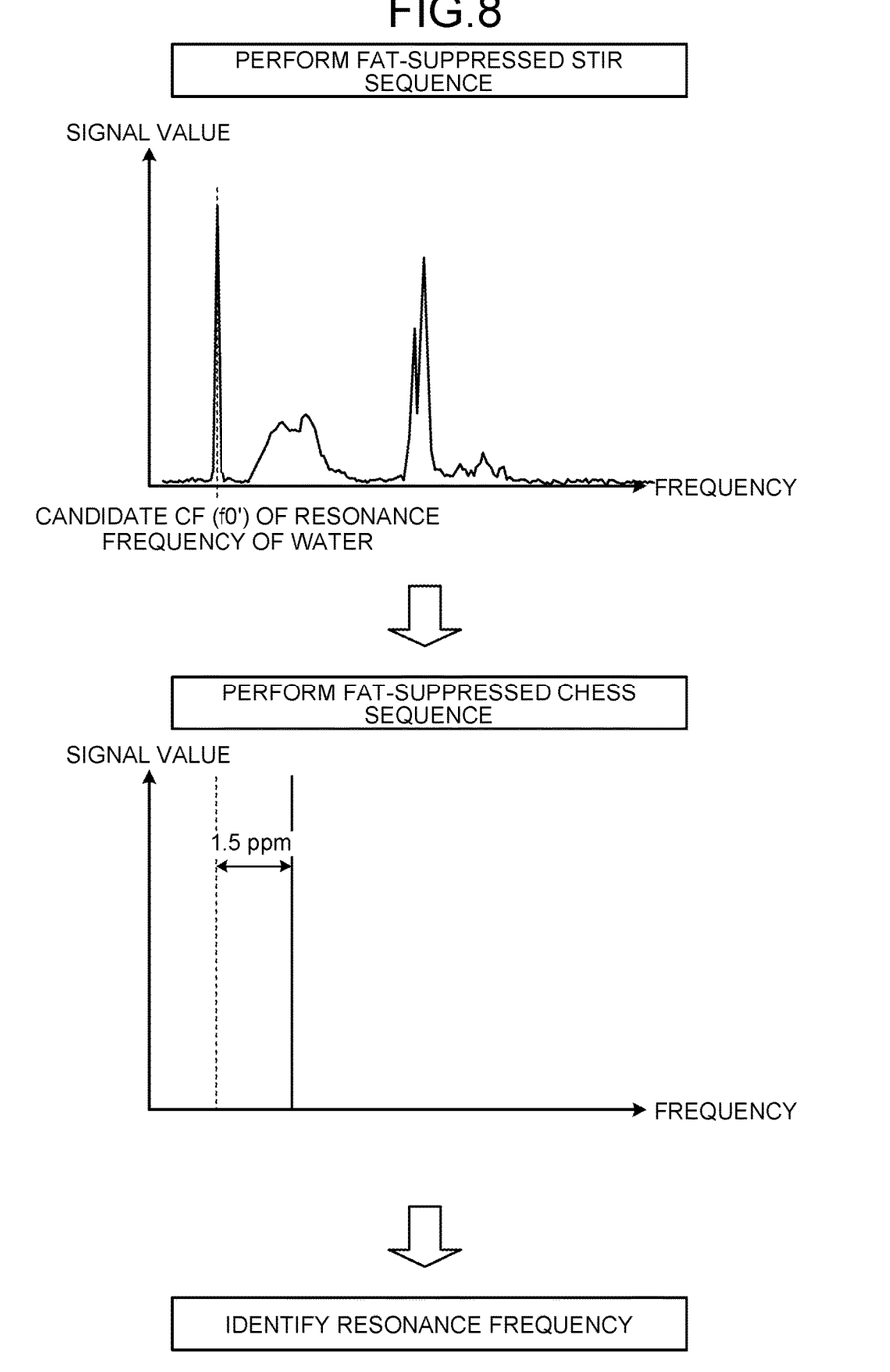
FIG. 8 is a schematic diagram to explain the second modification of the first embodiment.

FIGS. 7 and 8 are schematic diagrams to explain a second modification of the first embodiment. As illustrated in FIG. 7, a spectrum waveform of a certain substance appears in addition to the spectrum waveforms of water and fat in the frequency spectrum in some cases. The following description is made on the assumption that the resonance frequency of silicon is apart from the resonance frequency of fat in the plus direction by 1.5 ppm and also apart from the resonance frequency of water in the plus direction by 5.0 ppm.

If the peak of the spectrum waveform of silicon is the maximum peak, the resonance frequency candidate setting unit 26a may wrongly set the resonance frequency of silicon as the candidate CF (f0') of the resonance frequency of water. If the resonance frequency of silicon is set as the candidate CF (f0'), the candidates of the resonance frequency of fat are never close to the actual resonance frequency of fat even if the frequency spectrum collecting unit 26b collects seven frequency spectra as described in the first embodiment. As a result, the identification performed by the resonance frequency identifying unit 26c may not be done correctly.

To address such a situation caused by the other substance, the frequency spectrum collecting unit 26b may newly set the resonance frequency of fat using a frequency found in accordance with the property of the substance and perform the pulse sequence with the CHESS technique. For example, as illustrated in FIG. 8, the frequency spectrum collecting unit 26b may set the frequency apart from the candidate CF (f0') in the minus direction by 1.5 ppm as the candidate of the resonance frequency of fat and perform the pulse sequence with the CHESS technique once. As illustrated in FIG. 8, assuming that the resonance frequency of silicon is wrongly set as the candidate CF (f0'), the frequency apart from the candidate CF (f0') in the minus direction by 1.5 ppm should be indeed equal to the resonance frequency of fat. If the frequency spectrum collecting unit 26b sets this resonance frequency to the center frequency of the pre-pulses and performs the pulse sequence with the CHESS technique, the frequency spectrum should be collected in which signals of fat are appropriately suppressed. Thereafter, the resonance frequency identifying unit 26c identifies the resonance frequency as the resonance frequency of fat and also identifies the frequency apart from the resonance frequency in the minus direction by 3.5 ppm as the resonance frequency of water.

This manner enables the resonance frequency identifying unit 26c to finally identify appropriate resonance frequencies of water and fat even if the resonance frequency of silicon is wrongly set as the candidate of the resonance frequency of water.

The frequency spectrum collecting unit 26b may use the pulse sequence with the CHESS technique described in the second modification by combining it with the pulse sequence described in the other embodiments. For example, the frequency spectrum collecting unit 26b performs the pulse sequence with the CHESS technique on seven candidates as described in the first embodiment and thereafter may perform the pulse sequence with the CHESS technique described in the second modification once. For another example, the frequency spectrum collecting unit 26b performs the pulse sequence with the CHESS technique on seven candidates as described in the first embodiment and may perform the pulse sequence with the CHESS technique described in the second modification once when it is determined that the fat-suppression is not appropriately done in all of the seven candidates.

In the second modification, silicon is assumed as the other substance. The substance is not limited to silicon. Any substance such as an implant other than silicon may be assumed. In this case, the frequency spectrum collecting unit 26b may perform the pulse sequence with the CHESS technique by applying the pre-pulses at a frequency apart from the candidate CF (f0') by a difference in resonance frequency between the other substance and fat, for example.

Second Embodiment

A second embodiment is described below. In the first embodiment, the manner is described in which the pulse sequence with the STIR technique is performed, and thereafter the pulse sequence with the CHESS technique is performed on a plurality of candidates. The embodiment, however, is not limited to this manner. For example, a manner may be used in which it is determined whether the verification with the CHESS technique is required, and the pulse sequence with the CHESS technique is performed if necessary. The MRI apparatus 100 in the second embodiment has the same structure as the MRI apparatus 100 in the first embodiment.

Figure 9:
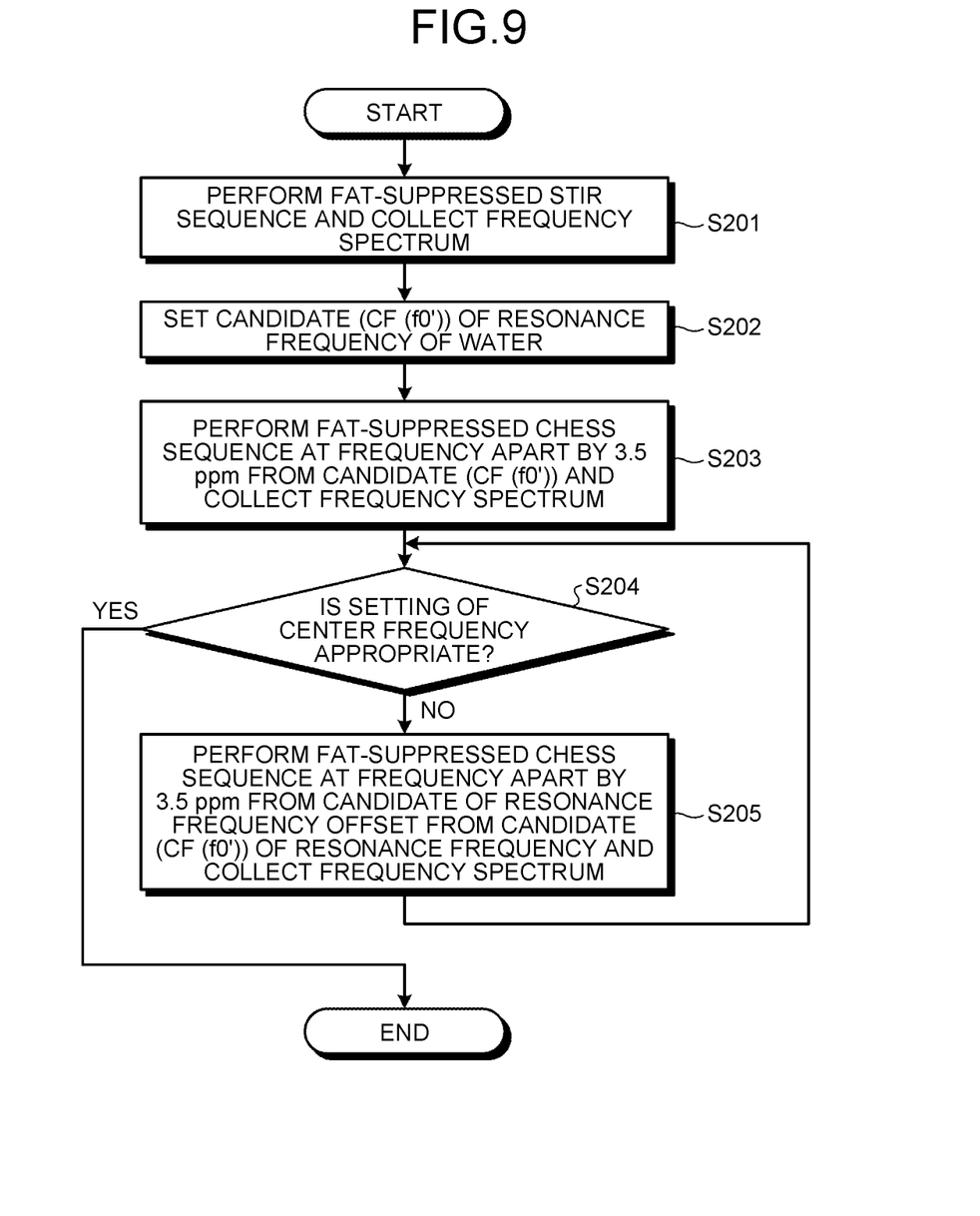
FIG. 9 is a flowchart illustrating a processing procedure according to a second embodiment.

FIG. 9 is a flowchart illustrating a processing procedure in the second embodiment. As illustrated in FIG. 9, the resonance frequency candidate setting unit 26a performs the pulse sequence with the STIR technique and collects the frequency spectrum (S201), and thereafter sets the candidate CF (f0') of the resonance frequency of water (S202).

Then, the frequency spectrum collecting unit 26b performs the pulse sequence with the CHESS technique at the frequency apart from the candidate CF (f0') of the resonance frequency of water set by the resonance frequency candidate setting unit 26a by 3.5 ppm in the plus direction and collects the frequency spectrum (S203).

The resonance frequency identifying unit 26c in the second embodiment determines whether the current setting of the center frequency (i.e., the candidate of the resonance frequency of fat) is appropriate (S204). For example, the resonance frequency identifying unit 26c prepares the integrated value of the signal values of the signals included in a frequency range corresponding to fat when the fat-suppression is appropriately done through an experiment performed in advance as a threshold used for determining whether the fat-suppression is appropriately done. Then, the resonance frequency identifying unit 26c analyzes the frequency spectrum collected at S203 and determines whether the integrated value of signals included in the frequency range corresponding to fat exceeds the prepared integrated value (threshold). If the integrated value exceeds the threshold (Yes at S204), the resonance frequency identifying unit 26c identifies the candidate CF (f0') as the appropriate resonance frequency of water, and ends the processing.

If the integrated value does not exceed the threshold (No at S204), the resonance frequency identifying unit 26c notifies the frequency spectrum collecting unit 26b of the determination. Receiving the notification, the frequency spectrum collecting unit 26b performs the pulse sequence with the CHESS technique at the frequency apart from the candidate of the resonance frequency of water by 3.5 ppm in the plus direction, which candidate is offset from the candidate CF (f0') of the resonance frequency of water, and collects the frequency spectrum (S205).

The resonance frequency identifying unit 26c determines again whether the current setting of the center frequency is appropriate (S204).

In this way, the resonance frequency identifying unit 26c in the second embodiment finds the analysis result from the signal values of the frequency spectrum each time when the frequency spectrum collecting unit 26b collects the frequency spectrum, and determines the appropriateness of the candidate of the resonance frequency by comparing the found analysis result with a certain threshold. The frequency spectrum collecting unit 26b determines whether the frequency spectrum collecting unit 26b finds a new frequency to be set to the center frequency of the pre-pulses in accordance with the determination result of the resonance frequency identifying unit 26c.

As a result, at the time when it is determined that the setting of the center frequency is appropriate, the MRI apparatus 100 in the second embodiment can identify the resonance frequency of water corresponding to the center frequency (the candidate of the resonance frequency of fat) without any change, and ends the processing.

A Modification of the Second Embodiment

Figure 10:
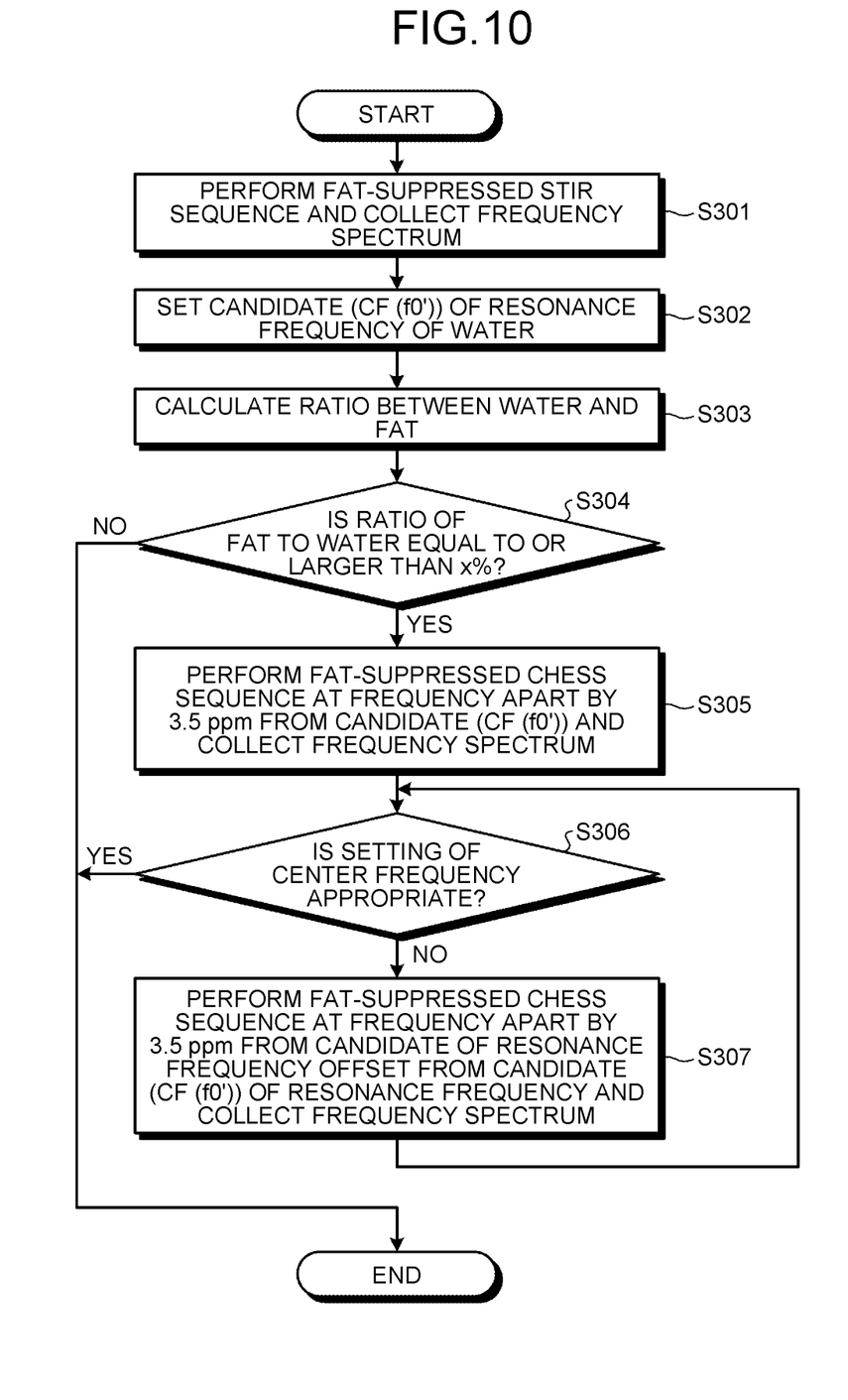
FIG. 10 is a flowchart illustrating a processing procedure in a modification of the second embodiment.

FIG. 10 is a flowchart illustrating a processing procedure in a modification of the second embodiment. As illustrated in FIG. 10, the resonance frequency candidate setting unit 26a performs the pulse sequence with the STIR technique and collects the frequency spectrum (S301), and thereafter sets the candidate CF (f0') of the resonance frequency of water (S302).

The frequency spectrum collecting unit 26*b* in the modification of the second embodiment analyzes the frequency spectrum collected at S301 and calculates the ratio of the signal value of fat to the signal value of water (S303). The signal value of water may be a signal value at a certain frequency or a value of integration of the signal values of the signals in a frequency range corresponding to water. The signal value of fat may be a signal value at a certain frequency or a value of integration of the signal values of the signals in a frequency range corresponding to fat. If the ratio of the signal value of fat is smaller than a predetermined threshold (x %) (No at S304), the frequency spectrum collecting unit 26*b* ends the processing without performing verification with the CHESS technique.

If the ratio of the signal value of fat is equal to or larger than the predetermined threshold (x %) (Yes at S304), the resonance frequency identifying unit 26*c* determines the appropriateness of the candidate every time when the frequency spectrum collecting unit 26*b* collects the frequency spectrum with the CHESS technique in the same manner as that described with reference to FIG. 9 (S305 to S307 correspond to S203 to S205 in FIG. 9).

When a portion to be imaged is a portion containing little fat such as a head, no verification with the CHESS technique is originally required. In such a case, it is effective from the viewpoint of reduction of imaging time to determine in advance that no verification is required and thus to perform no verification with the CHESS technique.

In the example of FIG. 10, the determination is made on the basis of the ratio of the signal value of fat to the signal value of water. The embodiment is not limited to the determination based on the ratio. For example, the frequency spectrum collecting unit 26*b* may determine the portion to be imaged on the basis of imaging conditions input to the MRI apparatus 100, and control may be made such that no verification with the CHESS technique is performed when the portion to be imaged is a head. The frequency spectrum collecting unit 26*b* may determine the portion to be imaged on the basis of information input to the MRI apparatus 100 through a hospital network such as a hospital information network (HIS).

Other Embodiments

The embodiment is not limited to the first and the second embodiments.

In the embodiments described above, the fat-suppression is done with the STIR technique when the candidate of the resonance frequency of water is set. The embodiment, however, is not limited to this manner. For example, a frequency spectrum is collected without performing the fat-suppression with the STIR technique and the candidate of the resonance frequency of water may be set on the basis of the collected frequency spectrum.

In the embodiments described above, the CHESS technique is described as an example of the pre-scan that frequency-selectively suppresses or enhances a certain substance. The embodiment, however, is not limited to the CHESS technique. Other techniques such as a spectral presaturation with inversion recovery (SPIR) technique and a polarity alternated spectral and spatial selective acquisition (PASTA) technique are also applicable in the same manner as the CHESS technique. In the SPIR technique, signals from fat are suppressed by applying frequency-selective pre-pulses so as to invert the longitudinal magnetization of fat. In the PASTA technique, signals from fat are relatively suppressed by exciting water (protons) by applying frequency-selective 90-degree pulse so as to enhance water.

In the embodiments described above, the candidate of the resonance frequency of "water" is verified and the resonance frequencies of "water" and "fat" are identified. The embodiment, however, is not limited to this manner. A desired substance, the resonance frequency of which is finally identified with high accuracy, may not be selected in the pre-scan but may be appropriately selected in accordance with the main scan performed after the pre-scan. The substance resonance frequency of which is first set as the candidate of the resonance frequency may be selected as appropriate. For example, the candidate of the resonance frequency of "fat" may be set on the basis of the frequency spectrum collected by a certain pulse sequence and the candidate may be verified by the pulse sequence with the CHESS technique without any change so as to identify the resonance frequency of "fat" with high accuracy. For another example, the candidate of the resonance frequency of "silicon" may be set on the basis of the frequency spectrum collected by the pulse sequence with the STIR technique and the candidate of "fat" apart from the candidate of "silicon" in the minus direction by 1.5 ppm may be verified so as to identify the resonance frequencies of "fat" and "water". In this way, the combination of substances can be changed as appropriate. It may be planned that how the center frequency of the pre-pulses is set in accordance with the selected substance.

The magnetic resonance imaging apparatus and the magnetic resonance imaging method in at least one of the embodiments described above can identify the resonance frequency of a desired substance with high accuracy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus, comprising:

MRI system components including static and gradient magnetic field generators, at least one radio frequency (RF) coil coupled to RF transmitter and RF receiver circuits, and digital signal processing circuits connected to control said components and configured to collect at least one frequency spectrum out of a plurality of frequency spectra by performing a pre-scan in which a first substance is frequency-selectively suppressed or enhanced;

obtain characteristics from the plurality of frequency spectra;

compare the obtained characteristics among the plurality of frequency spectra; and identify a resonance frequency of a second substance on the basis of comparison of the characteristics.

2. The magnetic resonance imaging apparatus according to claim 1, wherein the digital signal processing circuits are further configured to set the resonance frequency of the second substance identified on the basis of the comparison to a center frequency of a radio frequency (RF) pulse or a pre-pulse and perform a main scan.

3. The magnetic resonance imaging apparatus according to claim 1, wherein the digital signal processing circuits are configured to identify the resonance frequency of the second substance on the basis of the frequency spectrum in which the first substance is suppressed or enhanced at a high level.

4. The magnetic resonance imaging apparatus according to claim 1, wherein the digital signal processing circuits are configured to collect a first frequency spectrum by performing a first pre-scan, set at least one center frequency obtained from the first frequency spectrum, and collect a second frequency spectrum by performing a second pre-scan.

5. The magnetic resonance imaging apparatus according to claim 1, wherein the digital signal processing circuits are configured to collect the frequency spectra by performing a first pre-scan with a short time inversion recovery (STIR) technique and a second pre-scan in which the first substance is frequency-selectively suppressed or enhanced.

6. The magnetic resonance imaging apparatus according to claim 1, wherein the digital signal processing circuits are configured to collect a frequency spectrum by performing a first pre-scan, set a plurality of center frequencies that are different from each other and are obtained from the frequency spectrum, and collect the frequency spectra by performing a second pre-scan a plurality of times.

7. The magnetic resonance imaging apparatus according to claim 1, wherein the digital signal processing circuits are configured to collect the frequency spectra by performing the pre-scan in which the first substance is frequency-selectively suppressed or enhanced a plurality of times.

8. The magnetic resonance imaging apparatus according to claim 1, wherein the digital signal processing circuits are configured to collect the frequency spectra by performing the pre-scan with a chemical shift selective (CHESS) technique setting the resonance frequency of fat to a center frequency of a pre-pulse a plurality of times using a plurality of center frequencies that are different from each other.

9. The magnetic resonance imaging apparatus according to claim 1, wherein the digital signal processing circuits are configured to collect the frequency spectra by performing the pre-scan with a spectral presaturation with inversion recovery (SPIR) technique setting the resonance frequency of fat to a center frequency of a pre-pulse a plurality of times using a plurality of center frequencies that are different from each other.

10. The magnetic resonance imaging apparatus according to claim 1, wherein the digital signal processing circuits are configured to collect the frequency spectra by performing the pre-scan with a polarity alternated spectral and spatial selective acquisition (PASTA) technique setting the resonance frequency of water to a center frequency of a radio frequency (RF) pulse a plurality of times using a plurality of center frequencies that are different from each other.

11. The magnetic resonance imaging apparatus according to claim 1, wherein the digital signal processing circuits are configured to obtain signal values of signals included in a certain frequency range or an integrated value of the signal values for each frequency spectrum and identify the resonance frequency of the second substance by comparing the signal values or the integrated values among the frequency spectra.

12. The magnetic resonance imaging apparatus according to claim 1, wherein the digital signal processing circuits are configured to obtain an integrated value of all signal values for each frequency spectrum and identify the resonance frequency of the second substance by comparing the integrated values among the frequency spectra.

13. The magnetic resonance imaging apparatus according to claim 1, wherein the digital signal processing circuits are configured to set an analysis result obtained from any one of the frequency spectra as a reference value, obtain a change ratio with respect to the reference value on each of the other frequency spectra, and identify the resonance frequency of the second substance by comparing the change ratios among the frequency spectra.

14. The magnetic resonance imaging apparatus according to claim 1, wherein the digital signal processing circuits are configured to obtain for each frequency spectrum a ratio of signal values of signals included in a frequency range corresponding to the first substance or an integrated value of the signal values to signal values of signals included in a frequency range corresponding to the second substance or an integrated value of the signal values, and identify the resonance frequency of the second substance by comparing the ratios among the frequency spectra.

15. The magnetic resonance imaging apparatus according to claim 1, wherein when a plurality of notable spectrum waveforms that are highly likely to correspond to a certain substance appear as a result of an analysis of a frequency spectrum collected by performing a first pre-scan, the digital signal processing circuits are configured to collect the frequency spectra by performing a second pre-scan by focusing on center frequencies corresponding to the spectrum waveforms as targets to be set.

16. The magnetic resonance imaging apparatus according to claim 1, wherein the digital signal processing circuits are configured to set a candidate of the resonance frequency of a desired substance, set a plurality of frequencies found on the basis of the candidate of the resonance frequency to center frequencies of pre-pulses, and collect the frequency spectra by performing pulse sequences using the pre-pulses.

17. The magnetic resonance imaging apparatus according to claim 16, wherein
when the digital signal processing circuits are configured to
sequentially find the frequencies on the basis of the candidate of the resonance frequency, every time when a frequency spectrum is collected, find an analysis result of the frequency spectrum from a signal value of the frequency spectrum, and determine appropriateness of the resonance frequency by comparing the found analysis result with a certain threshold, and
determine whether or not a new frequency has been found to be set as a center frequency of the pre-pulse in accordance with a determination result of the appropriateness.

18. A magnetic resonance imaging apparatus, comprising:
MRI system components including static and gradient magnetic field generators, at least one radio frequency (RF) coil coupled to RF transmitter and RF receiver circuits, and
digital signal processing circuits connected to control said components and configured to
collect a first frequency spectrum by performing a first pre-scan with a short time inversion recovery (STIR) technique, obtain and set at least one center frequency from the first frequency spectrum, and collect a second frequency spectra by performing a second pre-scan in which a first substance is frequency-selectively suppressed or enhanced;
obtain characteristics from the plurality of the second frequency spectra, compare the obtained characteristics among the second frequency spectra, identify a resonance frequency of a second substance on the basis of the frequency spectrum in which the first substance is suppressed or enhanced at a high level, and set the resonance frequency of the second substance identified on the basis of comparison of the characteristics to a center frequency of a radio frequency (RF) pulse or a pre-pulse and perform a main scan.

19. A magnetic resonance imaging method executed by a magnetic resonance imaging apparatus, the magnetic resonance imaging method comprising:

collecting at least one frequency spectrum out of a plurality of frequency spectra by performing a pre-scan in which a first substance is frequency-selectively suppressed or enhanced;

obtaining characteristics from the plurality of the frequency spectra, comparing the obtained characteristics among the plurality of frequency spectra, and identifying a resonance frequency of a second substance on the basis of comparison of the characteristics.

* * * * *